United States Patent
Ahn et al.

(10) Patent No.: US 9,183,943 B2
(45) Date of Patent: Nov. 10, 2015

(54) NONVOLATILE MEMORY DEVICE AND CONTROL METHOD THEREOF

(71) Applicants: Yang-Lo Ahn, Seoul (KR); Sang-Wan Nam, Hwaseong-si (KR); Sang-Won Shim, Seoul (KR)

(72) Inventors: Yang-Lo Ahn, Seoul (KR); Sang-Wan Nam, Hwaseong-si (KR); Sang-Won Shim, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/104,406

(22) Filed: Dec. 12, 2013

(65) Prior Publication Data
US 2014/0226397 A1 Aug. 14, 2014

(30) Foreign Application Priority Data
Feb. 12, 2013 (KR) .......................... 10-2013-0015011

(51) Int. Cl.
*G11C 16/34* (2006.01)

(52) U.S. Cl.
CPC ........ *G11C 16/3427* (2013.01); *G11C 16/3422* (2013.01)

(58) Field of Classification Search
None
See application file for complete search history.

(56) References Cited

U.S. PATENT DOCUMENTS

| | | | |
|---|---|---|---|
| 6,819,592 B2 | 11/2004 | Noguchi et al. | |
| 7,196,964 B2 | 3/2007 | Fujiwara | |
| 7,349,258 B2 | 3/2008 | Fong et al. | |
| 7,423,912 B2 | 9/2008 | Perlegos et al. | |
| 7,457,160 B2 | 11/2008 | Kang et al. | |
| 7,460,403 B2 | 12/2008 | Lee | |
| 7,760,550 B2 | 7/2010 | Fayrushin et al. | |
| 7,852,676 B2 | 12/2010 | Maejima | |
| 8,154,927 B2 | 4/2012 | Lee et al. | |
| 2002/0159315 A1 | 10/2002 | Noguchi et al. | |
| 2005/0122826 A1 | 6/2005 | Fujiwara | |
| 2007/0133295 A1* | 6/2007 | Fong et al. ............... | 365/185.21 |
| 2008/0068896 A1 | 3/2008 | Perlegos et al. | |
| 2008/0094902 A1 | 4/2008 | Lee | |
| 2008/0101122 A1 | 5/2008 | Kang et al. | |
| 2009/0016110 A1 | 1/2009 | Choi et al. | |
| 2009/0268524 A1 | 10/2009 | Maejima | |
| 2011/0075484 A1 | 3/2011 | Lee et al. | |
| 2011/0317489 A1* | 12/2011 | Kim et al. ................ | 365/185.18 |
| 2012/0163081 A1* | 6/2012 | Park ........................ | 365/185.11 |
| 2012/0201080 A1 | 8/2012 | Kang et al. | |

* cited by examiner

*Primary Examiner* — James G Norman
(74) *Attorney, Agent, or Firm* — Harness, Dickey & Pierce, P.L.C.

(57) ABSTRACT

A vertical nonvolatile memory device which includes a plurality of cell strings formed in a direction intersecting with a substrate is provided. The vertical nonvolatile memory device is configured to apply a non-selection read voltage to at least one selection line connected to a cell string from among the plurality of cell strings. The vertical nonvolatile memory device is configured to apply the non-selection read voltage to at least one unselected word line of the cell string a desired time period after the applying of the non-selection read voltage to the at least one selection line.

19 Claims, 15 Drawing Sheets

NONVOLATILE MEMORY DEVICE AND CONTROL METHOD THEREOF

CROSS-REFERENCE TO RELATED APPLICATIONS

A claim for priority under 35 U.S.C. §119 is made to Korean Patent Application No. 10-2013-0015011 filed Feb. 12, 2013, in the Korean Intellectual Property Office, the entire contents of which are hereby incorporated by reference.

BACKGROUND

Inventive concepts described herein relate to a semiconductor memory device, and more particularly, to a nonvolatile memory device and/or a control method thereof.

Semiconductor memory devices may be characterized as volatile or nonvolatile. A volatile semiconductor memory device may perform read and write operations in a high speed, while data stored therein may be lost upon removal of power from the device. A nonvolatile semiconductor memory device may retain data stored therein even upon removal of power from the device. Accordingly, a nonvolatile semiconductor memory device may be used to store data which must be retained regardless of whether the device is powered.

A flash memory device may be a typical nonvolatile semiconductor memory device. The flash memory device may be used as a voice and image data storing medium for information appliances such as a computer, a cellular phone, a PDA, a digital camera, a camcorder, a voice recorder, an MP3 player, a handheld PC, a game machine, a facsimile, a scanner, a printer, and the like.

In recent years, research has been conducted on nonvolatile memory devices where memory cells are stacked three-dimensionally to improve a degree of integration of the devices. Such a nonvolatile memory device may be referred to as a vertical NAND flash memory device or a three-dimensional nonvolatile memory device. In the three-dimensional nonvolatile memory device, word lines may be stacked in a direction perpendicular to a substrate. Cell strings may be constituted by forming pillars to penetrate the stacked word lines.

The pillars may be disposed in a zigzag shape to improve efficiency of space arrangement. This structure may cause irregular driving characteristics of strings. Thus, a technique of solving such a problem of the three-dimensional nonvolatile memory device is desired.

SUMMARY

At least one example embodiment is directed to a vertical nonvolatile memory device which includes a plurality of cell strings formed in a direction intersecting with a substrate. The vertical nonvolatile memory device is configured to apply a non-selection read voltage to at least one selection line connected to a cell string from among the plurality of cell strings. The vertical nonvolatile memory device is configured to apply the non-selection read voltage to at least one unselected word line of the cell string a desired time period after the applying of the non-selection read voltage to the at least one selection line.

According to at least one example embodiment, the at least one selection line is a ground selection line connecting the cell string and a common source line.

According to at least one example embodiment, the cell strings are disposed in a zigzag shape between word line cuts.

According to at least one example embodiment, the vertical nonvolatile memory device is further configured to detect a level of a voltage on the at least one selection line.

According to at least one example embodiment, the desired time period is based on a time when the detected voltage level is equal to or higher than a reference level.

According to at least one example embodiment, the vertical nonvolatile memory device is further configured to apply a selection read voltage to a selected word line of the cell string after the desired time period.

At least one example embodiment is directed to a vertical nonvolatile memory device, including a cell array including a plurality of cell strings formed in a direction perpendicular to a substrate. The vertical nonvolatile memory device includes a row decoder connected to word lines and selection lines of the cell strings and configured to selectively transfer a word line voltage to the word lines and a selection line voltage to the selection lines. The vertical nonvolatile memory device further includes a voltage generator configured to supply, for a read operation, the row decoder with the selection line voltage and the word line voltage such that the word line voltage is applied to at least one of the word lines a desired time period after the selection line voltage is applied to at least one of the selection lines.

According to at least one example embodiment, the at least one selection line is a ground selection line configured to connect to at least one of the cell strings and a common source line.

According to at least one example embodiment, the voltage generator includes a timing circuit configured to control a duration of the desired time period.

According to at least one example embodiment, the timing circuit includes a delta set fuse configured to determine a difference between a voltage on the word line and a voltage on the selection line, a circuit element configured to calculate a reference value based on the difference and a target voltage of the word line, a comparator configured to compare a voltage on the selection line with the reference value, and a word line voltage generator configured to generate the word line voltage in response to an output of the comparator.

According to at least one example embodiment, the comparator is configured to activate the word line voltage generator if a voltage on the selection line is higher than the reference value.

According to at least one example embodiment, the cell strings are disposed in a zigzag shape between word line cuts.

At least one example embodiment is directed to a memory device including a non-volatile memory cell array including a plurality of cell strings formed in a vertical direction on a substrate, each cell string having at least one word line and at least one selection line. The memory device further includes a voltage generator connected to the cell strings, the voltage generator being configured to generate a word line voltage and a selection line voltage such that, for a read operation, the at least one word line begins charging a desired time period after the at least one selection line begins charging.

According to at least one example embodiment, the voltage generator includes a timing circuit configured to detect a voltage level on the at least one selection line.

According to at least one example embodiment, the timing circuit is configured to determine the desired time period based on the detected voltage level.

According to at least one example embodiment, the timing circuit is configured to determine the desired time period as a time difference between a first instant in time and a second instant in time, the first instant in time corresponding to an instant in time when the selection line voltage is initially applied to the at least one selection line, the second instant in time corresponding to an instant in time when the detected voltage level reaches a threshold voltage level after the initial application of the selection line voltage.

According to at least one example embodiment, the at least one selection line is a ground selection line.

According to at least one example embodiment, the at least one word line is an unselected word line.

According to at least one example embodiment, the plurality of cell strings includes a plurality of conductive pillars formed in a zigzag pattern.

According to at least one example embodiment, the conductive pillars are separated by at least one word line cut.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION OF EXAMPLE EMBODIMENTS

Figure 1:
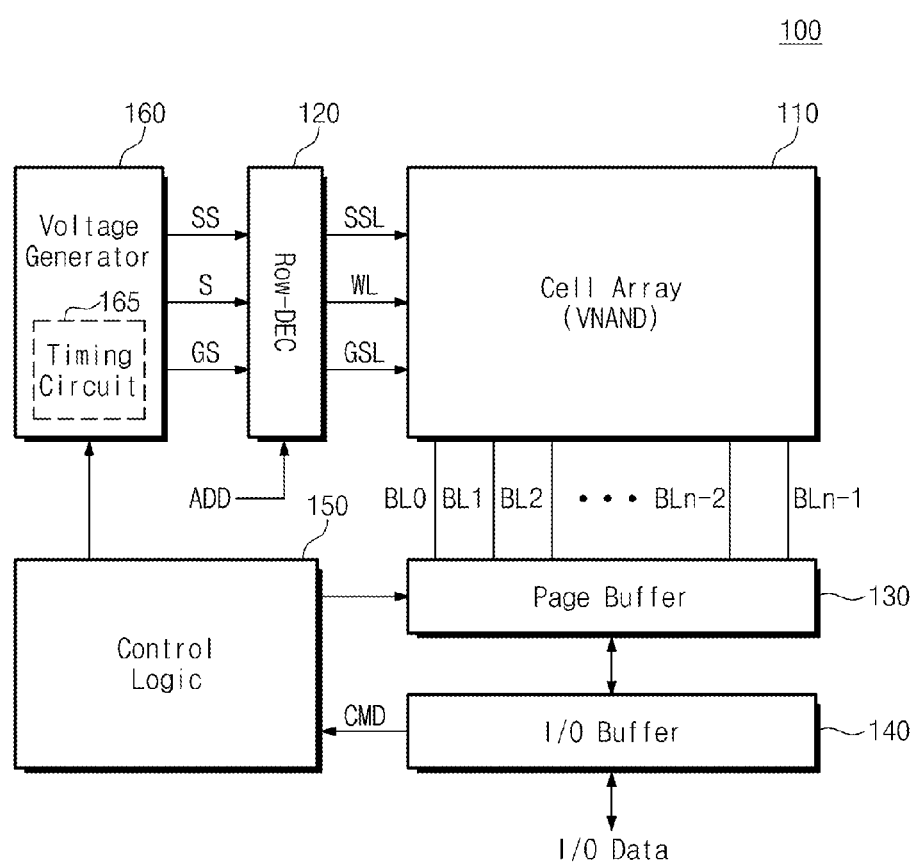
FIG. 1 is a block diagram schematically illustrating a nonvolatile memory device according to at least one example embodiment of inventive concepts.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or this specification and will not be interpreted in an idealized or overly formal sense unless expressly so defined herein.

Below, features and functions of the inventive concept will be exemplarily described using a flash memory device as a nonvolatile storage medium. However, inventive concepts are not limited thereto. Also, the storage medium may be formed of other nonvolatile memory devices. For example, the storage medium may be formed of a PRAM, an MRAM, a ReRAM, a FRAM, a NOR flash memory, or the like.

Inventive concepts may be implemented by different embodiments or applied thereto. Further, example embodiments may be modified or changed according to viewpoints and applications without departing from the scope, spirit and other objects of inventive concepts. Below, inventive concepts will be described with reference to accompanying drawings.

FIG. 1 is a block diagram schematically illustrating a nonvolatile memory device according to at least one example embodiment of inventive concepts. Referring to FIG. 1, a nonvolatile memory device 100 may include a cell array 110, a row decoder 120, a page buffer 130, an input/output buffer 140, control logic 150, and a voltage generator 160.

The cell array 110 may be connected to the row decoder 120 through word lines WL and selection lines SSL and GSL. The cell array 110 may be connected to the page buffer 130 through bit lines BL0 to BLn−1. The cell array 110 may include a plurality of NAND cell strings. The NAND cell strings may constitute a plurality of memory blocks according to an operating or selecting unit.

Here, each NAND cell string may be formed in a vertical direction. The word lines of the cell array 110 may be stacked in a vertical direction, and channels of the NAND cell strings may be formed in the vertical direction. A nonvolatile memory device where the cell array 110 is formed to have the above-described structure may be referred to as a vertical NAND flash memory device (VNAND) or a three-dimensional nonvolatile memory device.

The row decoder 120 may select one of the memory blocks of the cell array 110 in response to an address ADD. The row decoder 120 may select one of word lines of the selected memory block. The row decoder 120 may provide the selected word line with a word line voltage. At a program operation, the row decoder 120 may transfer a program or verification voltage to a selected word line and a pass voltage to an unselected word line(s). At a read operation, the row decoder 120 may transfer a selection read voltage to a selected word line and a non-selection read voltage to an unselected word line(s). At this time, the non-selection read voltage may be applied to the selection lines SSL and GSL.

The page buffer 130 may act as a write driver or a sense amplifier according to a mode of operation. For a program operation, the page buffer 130 may provide the bit lines BL0 to BLn−1 of the cell array 110 with bit line voltages corresponding to data to be programmed. For a read operation, the page buffer 130 may sense and latch data stored at selected memory cells through the bit lines BL0 to BLn−1. The page buffer 130 may float the bit lines during an erase operation.

For a program operation, the input/output buffer 140 may transfer write data to the page buffer 130. For a read operation, the input/output buffer 140 may output read data provided from the page buffer 130 to an external device. The input/output buffer 140 may provide an input address or command to the control logic 150 or the row decoder 120.

The control logic 150 may control the page buffer 130 and the row decoder 120 in response to a command CMD transferred by the I/O buffer 140 from an external device. The control logic 150 may control the page buffer 130 and the voltage generator 160 in response to a command from the external device to access selected memory cells.

The voltage generator 160 may be controlled by the control logic 150, and may generate word line voltages to be applied to word lines, a voltage to be supplied to a bulk where memory cells are formed, and so on. The word line voltages may include a program voltage, a pass voltage, selection and non-selection voltages, and so on. The voltage generator 160 may generate selection line voltages SS and GS to be applied to the selection lines SSL and GSL for a read and/or a program operation.

The voltage generator 160 may generate a voltage for selecting a memory cell at a read or write operation. For example, the voltage generator 160 may generate a word line voltage S and the selection line voltages SS and GS. The word line voltage S and the selection line voltages SS and GS may be transferred to the cell array 110 through the row decoder 120. The voltage generator 160 may control an application timing of the word line voltage S and the selection line voltages SS and GS applied to a selected cell string in a specific mode (e.g., a read mode). That is, the voltage generator 160 may start to set up (or begin applying) the word line voltage S at a point in time when one of the selection line voltages SS and GS exceeds a reference level. With this control scheme, distortion of word line voltage waveforms and/or read disturbance generated by a distance difference between cell strings and a common source line may be solved. The voltage generator 160 may include a timing circuit 165 to adjust the application timing of the word line voltage S and the selection line voltages SS and GS.

A structure of the nonvolatile memory device 100 according to at least one example embodiment of inventive concepts has been described. The voltage generator 160 may solve distortion of word line voltage waveforms and/or read disturbance generated by locations of cell strings by controlling an application timing of the word line voltage S and the selection line voltages SS and GS.

The above description of FIG. 1 relates to an example embodiment where application times of voltages of the voltage generator 160 are controlled (e.g., voltages of word lines and selection lines are controlled). However, inventive concepts are not limited thereto. For example, the voltage generator 160 may generate the word line voltage S and the selection line voltages at the same point in time, and/or may implement a delay through a switching of the row decoder 120.

Figure 2:
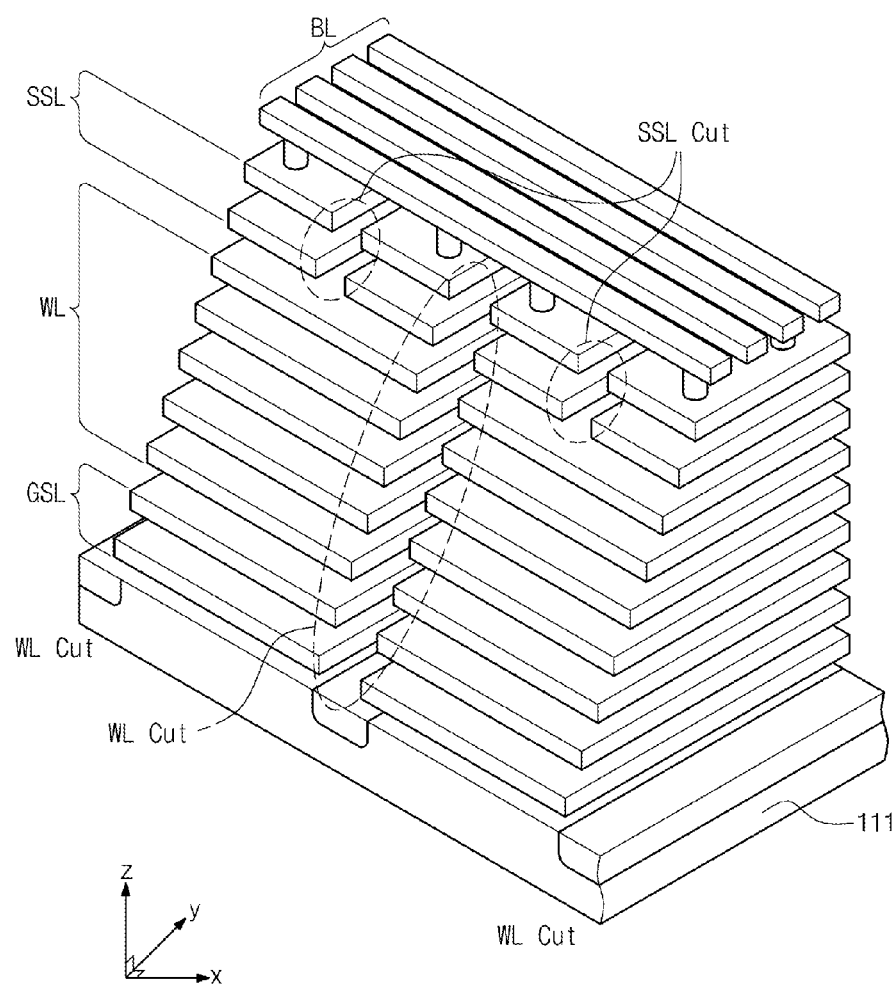
FIG. 2 is a perspective view of a memory block according to at least one example embodiment of inventive concepts.

FIG. 2 is a perspective view of a memory block according to at least one example embodiment of inventive concepts. Referring to FIG. 2, ground selection lines GSL, word lines WL, and string selection lines SSL may be stacked on a substrate 111. The stacked lines may be separated by a word line cut WL Cut. Here, at least one string selection line SSL may be separated by a string selection line cut SSL Cut.

A plurality of pillars may penetrate at least one ground selection line GSL, word lines WL, and at least one string selection line SSL in a z direction. Here, at least one ground selection line GSL, word lines WL, and at least one string selection line SSL may be formed of conductive materials. A plurality of bit lines may be formed on upper surfaces of the pillars. The pillars may be connected to corresponding bit lines.

FIG. 2 shows that each of the string and ground selection lines SSL and GSL is formed of two conductive layers. However, the inventive concept is not limited thereto. For example, each of the string and ground selection lines SSL and GSL may be formed of one conductive layer or three or more conductive layers.

Figure 3:
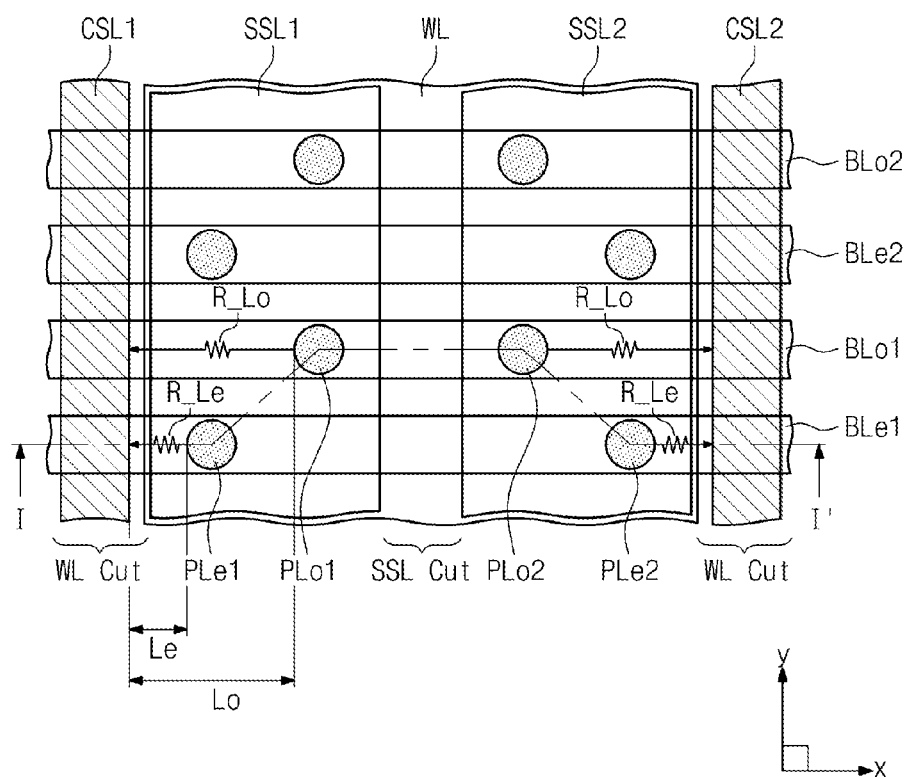
FIG. 3 is a diagram schematically illustrating an upper surface of the memory block of FIG. 2.

FIG. 3 is a diagram schematically illustrating an upper surface of a memory block of FIG. 2. Referring to FIG. 3, common source lines CSL1 and CSL2 may exist at the lowermost surfaces of word line cuts WL Cut, and a string selection line cut SSL Cut may be between the word line cuts WL Cut.

The common source lines CSL1 and CSL2 may be formed under the word line cuts WL Cut. Pillars may be formed for constituting cell strings connected with the common source line CSL1. Here, inventive concepts will be described on the basis of pillars PLe1, PLo1, PLe2, and PLo2, connected to bit lines BLe1 and BLo1. It should be understood that the locations and electrical characteristics of pillars connected to the remaining bit lines BLe2 and BLo2 may be the same as or similar to PL1, PLo1, PLe2, and PLo2.

Referring to pillars PLe1 and PLo1 connected to the string selection line SSL1 and the bit lines BLe1 and BLo1, a vertical cell string formed of the pillar PLe1, ground selection lines (not shown), word lines, and the string selection line SSL1 may be spaced apart from the common source line CSL1 by a first distance Le in an x direction. Also, a vertical cell string formed of the pillar PLo1, the ground selection lines, the word lines, and the string selection line SSL1 may be spaced apart from the common source line CSL1 by a second distance Lo in the x direction. This pillar arrangement may be equally applied to pillars connected with the string selection line SSL1 and the bit lines BLe2 and BLo2.

Referring to pillars PLe2 and PLo2 connected to the string selection line SSL2 and the bit lines BLe1 and BLo1, a vertical cell string formed of the pillar PLe2, the ground selection lines, the word lines, and the string selection line SSL2 may be spaced apart from the common source line CSL2 by the first distance Le in the x direction. Also, a vertical cell string formed of the pillar PLo2, the ground selection lines, the word lines, and the string selection line SSL2 may be spaced apart from the common source line CSL2 by the second distance Lo in the x direction. That is, the pillars PLe2 and PLo2 connected to the string selection line SSL2 and the bit lines BLe1 and BLo1 may be symmetrical to the pillars PLe1 and PLo1 connected to the string selection line SSL1 and the bit lines BLe1 and BLo1 on the basis of a y-axis.

Channels of cell strings formed by the pillars may be connected to the common source lines CSL1 and CSL2 in a read operation. Channel lengths between the even-numbered pillars PLe1 and PLe2 and the common source lines CSL1 and CSL2 may correspond to the first distance Le. Channel lengths between the odd-numbered pillars PLo1 and PLo2 and the common source lines CSL1 and CSL2 may correspond to the second distance Lo. Thus, the channel lengths between the even-numbered pillars PLe1 and PLe2 and the common source lines CSL1 and CSL2 may be different from the channel lengths between the odd-numbered pillars PLo1 and PLo2 and the common source lines CSL1 and CSL2. In other words, a channel resistance R_Le between the even-numbered pillars PLe1 and PLe2 and the common source lines CSL1 and CSL2 may be different from a channel resistance R_Lo between the odd-numbered pillars PLo1 and PLo2 and the common source lines CSL1 and CSL2. For example, channel resistance R_Le between the even-numbered pillar PLe1 and the first common source line CSL1 may be less than channel resistance R_Lo between the odd-numbered pillar PLo1 and the first common source line CSL1.

A difference between a channel resistance value of an even-numbered pillar and a channel resistance value of an odd-numbered pillar may cause a difference between currents flowing to channels of the even-numbered and odd-numbered pillars under the same bias condition. The difference between channel currents may cause a difference between threshold voltages of ground selection transistors GST of even-numbered and odd-numbered cell strings. In the case of an unselected cell string, if a word line voltage is applied before formation of a channel in a read operation, memory cells may experience a read disturbance phenomenon caused by distributions that are shifted by hot electron injection.

However, according to at least one inventive concept, this problem may be solved by controlling setup times of a selection line SSL or GSL and a word line to be different.

Figure 4:
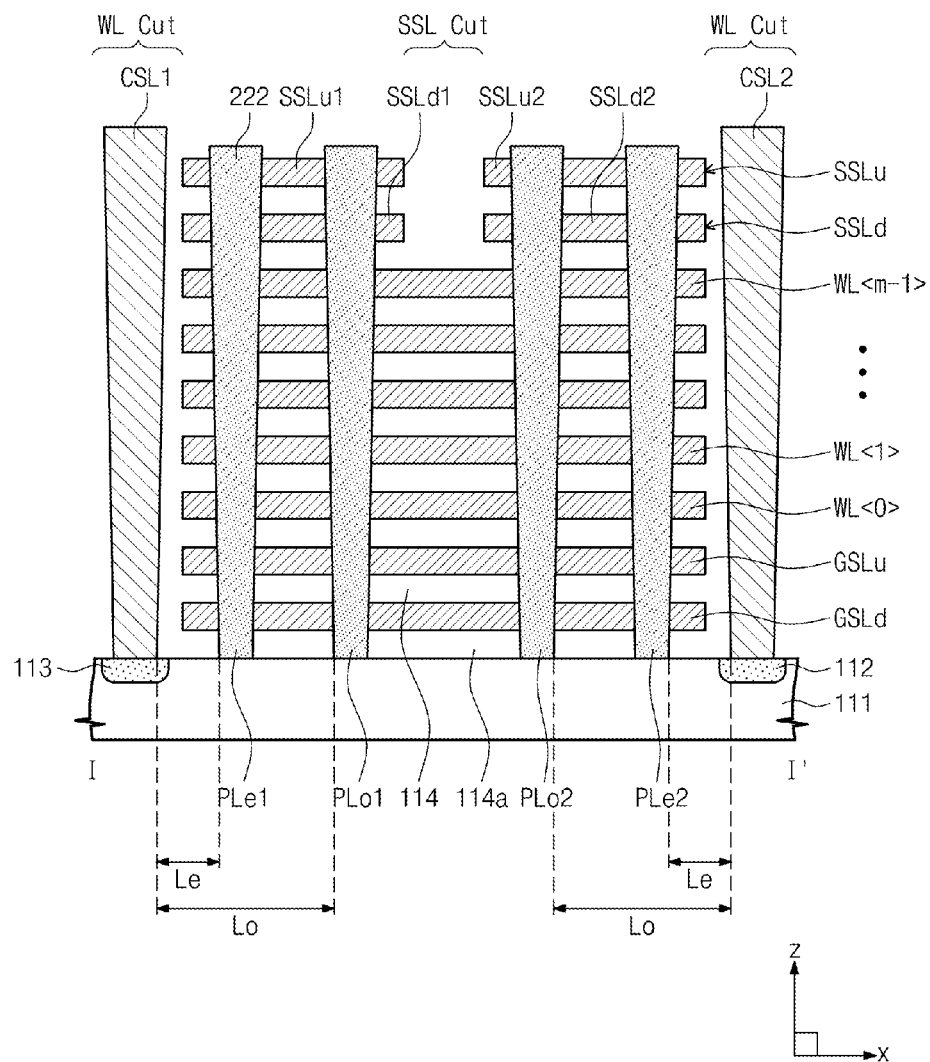
FIG. 4 is a cross-sectional view of the memory block taken along a line I-I' of FIG. 3.

FIG. 4 is a cross-sectional view of a memory block taken along a line I-I' of FIG. 3. Referring to FIG. 4, it should be understood that a distance between even-numbered pillars PLe1 and PLe2 and common source lines is different from a distance between odd-numbered pillars PLo1 and PLo2 and common source lines.

A substrate 111 may be a well having a first conductive type. For example, the substrate 111 may be a p-well formed by implanting Group III element such as boron. For example, the substrate 111 may be a pocket p-well provided in an n-well.

A plurality of doping regions 112 and 113 extending along a y-direction may be provided at the substrate 111. The doping regions 112 and 113 may be spaced apart from each other along an x-direction. The doping regions 112 and 113 may have a second conductive type different from that of the substrate 111. For example, the doping regions 112 and 113 may be n-type. Below, it is assumed that the doping regions 112 and 113 are n-type. However, inventive concepts are not limited thereto.

On the substrate 111 between the doping regions 112 and 113, a plurality of insulation materials 114 may be sequentially provided along a z-direction (i.e., a direction perpendicular to a substrate). The insulation materials 114 and 114a may be spaced apart from one other along the z-direction. The insulation materials 114 and 114a may extend along the y-direction. In at least one example embodiment, the insulation materials 114 and 114a may include an insulation material such as silicon oxide. A thickness of an insulation material 114a contacting the substrate 111 may be thinner than that of each of the remaining insulation materials 114.

Between the doping regions 112 and 113, a plurality of pillars PLe1, PLe2, PLo1, and PLo2 may be sequentially disposed along the x-direction and penetrate the insulation materials 114 and 114a along the z-direction. In at least one example embodiment, the pillars PLe1, PLe2, PLo1, and PLo2 may contact the substrate 111 through the insulation materials 114 and 114a. Here, the pillars PLe1 and PLe2 may be connected to an even-numbered bit line, and the pillars PLo1 and PLo2 may be connected to an odd-numbered bit line.

In at least one example embodiment, each of the pillars PLe1, PLe2, PLo1, and PLo2 may be formed of a multi-layer. Each of the pillars PLe1, PLe2, PLo1, and PLo2 may include a channel film and an inner material. For example, each of the pillars PLe1, PLe2, PLo1, and PLo2, may include an inner material and a channel film surrounding the inner material. The channel film may include a semiconductor material (e.g., silicon) having a first conductive type. For example, the channel film may include a semiconductor material (e.g., silicon)

having the same conductive type as that of the substrate 111. Here, it is assumed that the channel includes p-type silicon. However, inventive concepts are not limited thereto. For example, the channel film may include intrinsic semiconductor.

The inner material may include an insulation material. For example, the inner material may include an insulation material such as silicon oxide. As another example, the inner material may include an air gap.

Information storage films may be provided on exposed surfaces of the insulation materials 114 and the pillars PLe1, PLe2, PLo1, and PLo2. In at least one example embodiment, a thickness of the information storage film may be less than a distance between the insulation materials 114. In at least one example embodiment, the pillars PLe1, PLe2, PLo1, and PLo2 may be disposed to have a zigzag structure. With this zigzag structure, it is possible to reduce an area of memory cells.

The pillars PLe1, PLe2, PLo1, and PLo2 may form vertical strings with adjacent information storage films and adjacent conductive materials. That is, the pillars PLe1, PLe2, PLo1, and PLo2 may form vertical strings with information storage films and conductive materials. Each of the vertical strings may include cell strings stacked in a direction perpendicular to the substrate 111.

A string selection line SSL may include upper string selection lines SSLu1 and SSLu2 and lower string selection lines SSLd1 and SSLd2. The upper string selection lines SSLu1 and SSLu2 and lower string selection lines SSLd1 and SSLd2 may be separated by a string selection line cut SSL cut. However, inventive concepts are not limited thereto. For example, the string selection line SSL can be formed of at least one line.

A ground selection line GSL may include an upper ground selection line GSLu and a lower ground selection line GSLd. However, the inventive concept is not limited thereto. For example, the ground selection line GSL can be formed of at least one line.

A common source line CSL may include first and second common source lines CSL1 and CSL2. Although not shown, the first and second common source lines CSL1 and CSL2 may be electrically connected to each other. The first and second common source lines CSL1 and CSL2 may extend on the plurality of doping regions 112 and 113, and may be included in the word line cut.

Figure 5A:
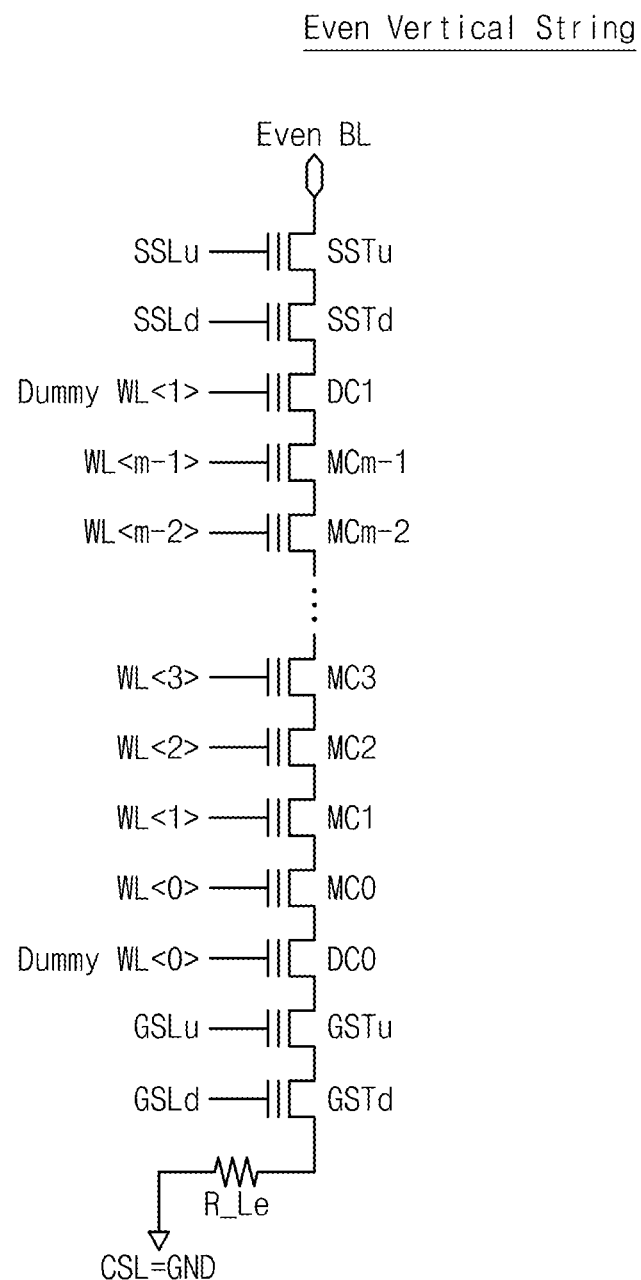
FIGS. 5A and 5B are circuit diagrams schematically illustrating an even-numbered vertical string and an odd-numbered vertical string.
Figure 5B:
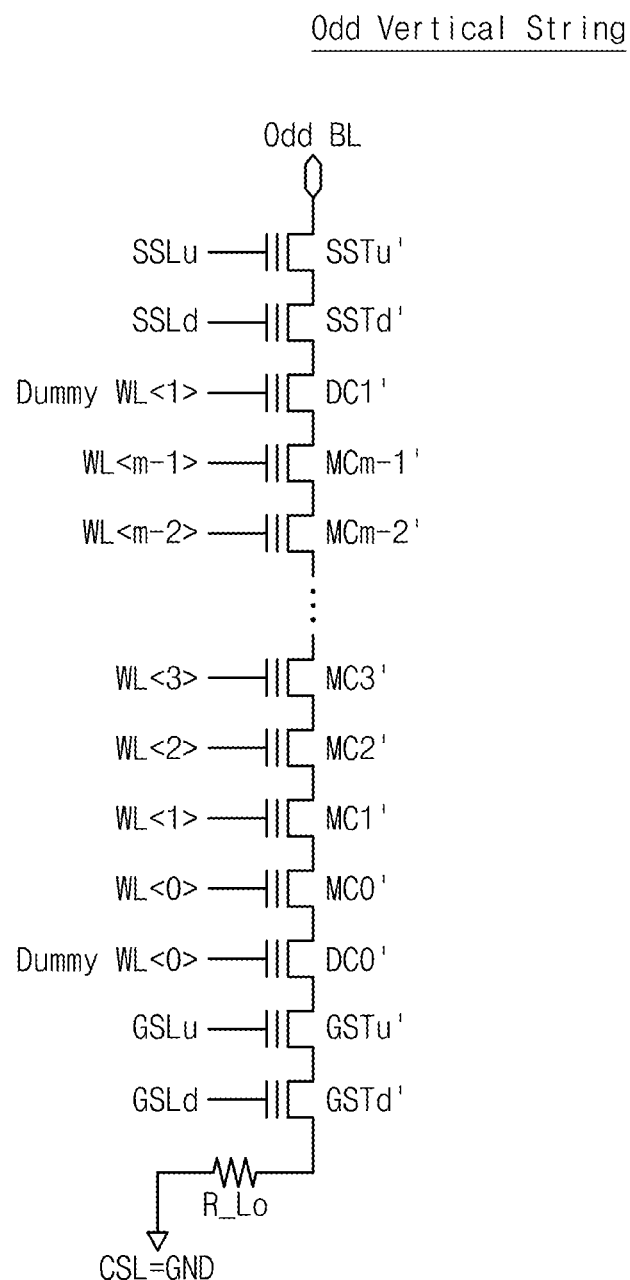

FIGS. 5A and 5B are circuit diagrams schematically illustrating an even-numbered vertical string and an odd-numbered vertical string. FIG. 5A shows a vertical string (even-numbered vertical string) corresponding to even-numbered pillars PLe1 and PLe2. Referring to FIG. 5A, an even-numbered vertical string may include string selection transistors SSTu and SSTd connected between an even-numbered bit line and a channel of the vertical string, a plurality of serially connected memory cells formed at the channel of the vertical string, ground selection transistors GSTu and GSTd connected between the channel of the vertical string and a common source line CSL, a dummy cell DC0 connected between a memory cell MC0 and the ground selection transistor GSTu, and a dummy cell DC1 connected between a memory cell MCm and the string selection transistor SSTd.

Here, gates of the string selection transistors SSTu and SSTd may be connected to string selection lines SSLu and SSLd, respectively. Gates of the memory cells MC0 to MCm-1 may be connected to word lines WL<0> to WL<m-1>, respectively. Gates of the ground selection transistors GSTu and GSTd may be connected to ground selection lines GSLu and GSLd, respectively. Gates of the dummy cells DC0 and DC1 may be connected to dummy word lines Dummy WL<0> and Dummy WL<1>, respectively.

The even-numbered vertical string may be modeled to have channel resistance R_Le according to a physical distance from a common source line CSL1.

FIG. 5B shows a vertical string (odd-numbered vertical string) corresponding to odd-numbered pillars PLo1 and PLo2. The odd-numbered vertical string of FIG. 5B may have the same structure as that of FIG. 5A. However, the odd-numbered vertical string may be connected to a common source line CSL through channel resistance R_Lo by a distance difference between a pillar and the common source line CSL. Here, a value of channel resistance R_Lo may be larger than that of the channel resistance R_Le.

With the above description, it should be understood that an even-numbered vertical string connected to an even-numbered bit line BLe and an odd-numbered vertical string connected to an odd-numbered bit line BLo are connected to a common source line through different channel resistance R_Le and R_Lo. That is, since the even-numbered vertical string is asymmetrical to the odd-numbered vertical string, an operating characteristic of the even-numbered vertical string may be different that of the odd-numbered vertical string.

A nonvolatile memory device 100 according to at least one example embodiment of inventive concepts may be implemented to minimize (or alternatively, remove) a difference between electrical characteristics caused by an asymmetrical structure of vertical strings in a sensing operation.

Figure 6:
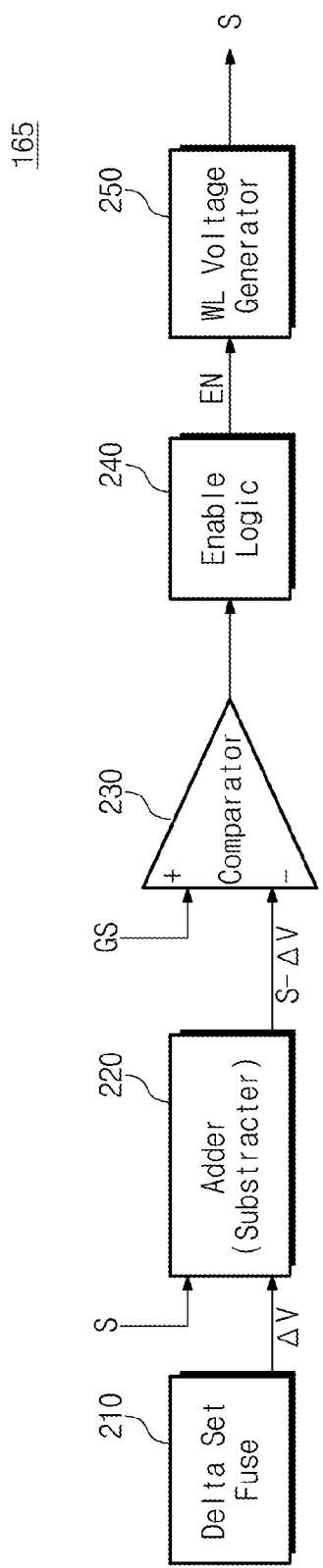
FIG. 6 is a block diagram schematically illustrating an example timing circuit for the device of FIG. 1 according to at least one example embodiment of inventive concepts.

FIG. 6 is a block diagram schematically illustrating a timing circuit of FIG. 1. Referring to FIG. 6, a timing circuit 165 may include a delta set fuse 210, an adder 220, a comparator 230, enable logic 240, and a word line voltage generator 250. The timing circuit 165 may generate a word line voltage S to be applied to a word line at a point in time delayed by a desired time based on a setup voltage level of a ground selection line GSL.

The delta set fuse 210 may be used to program information for appointing a setup timing (or application timing) of a word line voltage. The delta set fuse 210 may store information for setting a degree of delay between setup timing of the ground selection voltage GS and setup timing of a word line voltage S, for example. If a voltage on the ground selection line GSL reaches a desired level, the timing circuit 165 may be configured to instruct the voltage generator 160 to start to set up (or begin charging, or initialize) a word line WL. For this, the delta set fuse 210 may store a voltage difference ΔV corresponding to a delay between the setup timing of the ground selection line GSL and the setup timing of the word line WL.

The adder 220 may calculate a difference (S−ΔV) between the voltage difference ΔV provided from the delta set fuse 210 and a target word line voltage S provided to a word line. That is, the adder 220 may calculate a setup voltage level of the ground selection line GSL for deciding a point in time when the word line WL starts to be set up. That is, a difference generated from the adder 220 may correspond to a setup reference value (S−ΔV) of the ground selection line GSL. Here, the target word line voltage S and the voltage difference ΔV may be expressed by a binary code.

The comparator 230 may compare a ground selection line voltage GS on the ground selection line GSL and the reference value (S−ΔV). The comparator 230 may output a logic '1' value when a setup voltage level of the ground selection line GSL is higher than the reference value (S−ΔV).

The enable logic 240 may control the word line voltage generator 250 in response to an output of the comparator 230. The word line voltage generator 250 may start to set up (or begin charging, or initialize) a word line in response to an enable signal EN of the enable logic 240.

Here, a setup voltage S of the word line WL and a setup voltage of the ground selection line GSL may be a non-selection read voltage Vread provided to unselected word lines for a read operation. However, inventive concepts are not limited thereto.

Based on the above description, the voltage generator 160 may start to set up (or begin charging, or initialize) a word line when a setup voltage of the ground selection line GSL is higher than a reference value. However, the timing circuit 165 for providing a delay between setup timing of the ground selection line GSL and setup timing of the word line may be implemented by various manners.

Figure 7:
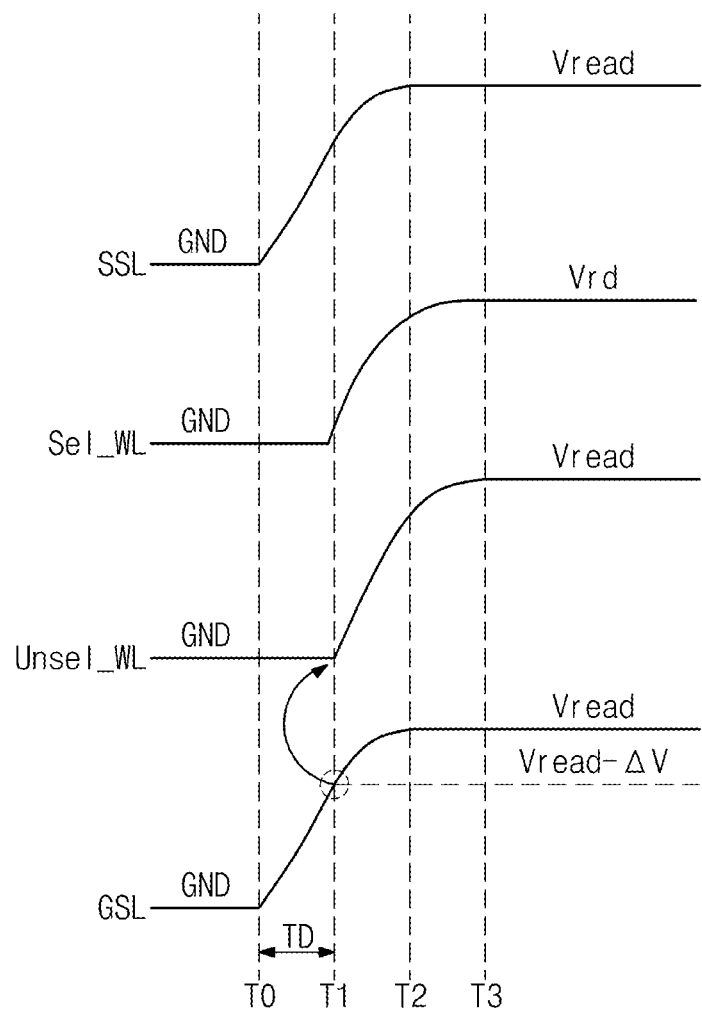
FIG. 7 is a waveform diagram schematically illustrating voltages provided at a read operation of a nonvolatile memory device according to at least one example embodiment of inventive concepts.

FIG. 7 is a waveform diagram schematically illustrating voltages provided at a read operation of a nonvolatile memory device according to at least one example embodiment of inventive concepts. Referring to FIG. 7, for a read operation, word lines (excluding dummy word lines) may start to be set up (or begin charging, or initialize) at a point of time delayed by a desired time TD as compared to a point of time when a ground selection line GSL starts to be set up (or begins charging).

Once a read operation commences, at time T0, selection lines SSL and GSL may start to be set up (or begin charging, or initialize). Here, a description of bit lines is omitted because a bias of a selected bit line is different from a bias of an unselected bit line. Setup voltage levels of the selection lines SSL and GSL may gradually increase to a non-selection read voltage Vread provided from a voltage generator 160 (refer to FIG. 1).

At time T1, a voltage on the ground selection line GSL may reach a reference value (Vread−ΔV) during a time TD (i.e., a desired time period). At this time, a timing circuit 165 may detect a voltage level of the ground selection line GSL to start a setup operation on word lines (including selected and unselected word lines). Here, a voltage of a selected word line Sel_WL may start to be set up (or begin charging, or initialize) from time T1 and reach a selection read voltage Vrd at time T3. A voltage of an unselected word line Unsel_WL may start to be set up (or begin charging, or initialize) from time T1 and reach the non-selection read voltage Vread at time T3. A setup time of the selected word line may be faster than a setup time of an unselected word line Unsel_WL. This is because the selection read voltage Vrd is lower than the non-selection read voltage Vread, and as such, a time taken to set up the selected word line to a target level of selection read voltage Vrd is shorter.

At time T2, voltages set up on the selection lines SSL and GSL may reach a target level of the non-selection read voltage Vread. Accordingly, a point of time when setup of the selection lines SSL and GSL is completed may be faster than a point of time when setup of the word lines (including selected and unselected word lines) is completed.

There is described an example embodiment where setup timing of the selection lines SSL and GSL is faster than that of word lines. Also, there is described an example embodiment where word lines (including selected and unselected word lines) start to be set up (or begin charging, or initialized) at a point of time delayed by a desired time TD from a setup point of time of the ground selection line GSL. However, inventive concepts are not limited thereto. For example, word lines (including selected and unselected word lines) may start to be set up at a point of time delayed by a desired time TD from a setup point of time of the string selection line SSL for switching a bit line and a cell string.

Figure 8:
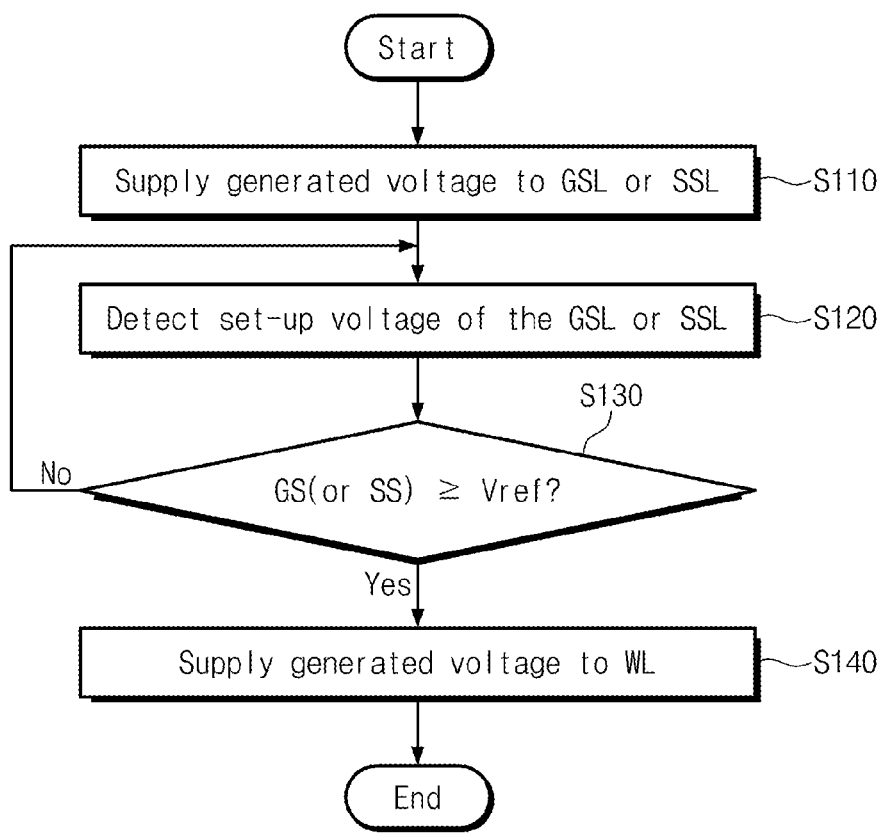
FIG. 8 is a flow chart schematically illustrating a cell string driving voltage generating method according to at least one example embodiment of inventive concepts.

FIG. 8 is a flow chart schematically illustrating a cell string driving voltage generating method according to at least one example embodiment of inventive concepts. Referring to FIG. 8, a setup point of time (or initialization) of a word line voltage may be controlled based on a setup voltage level of a ground selection line GSL.

In operation S110, a voltage generated by a voltage generator 160 may be applied to selection lines SSL and GSL. Here, a voltage provided to the selection lines GSL and SSL may be a non-selection read voltage Vread.

In operation S120, a setup voltage of at least one of the selection lines SSL and GSL may be detected. For example, a setup voltage of the ground selection line GSL may be detected.

In operation S130, whether a setup voltage GS or SS on one of the selection lines SSL and GSL is equal to or higher than a reference level Vref may be determined. This determination may be made through a comparator 230 (refer to FIG. 6). For example, if a setup voltage of the ground selection line GSL is higher than the reference level Vref, the method may proceed to operation S140. If a setup voltage of the ground selection line GSL is lower than the reference level Vref, the method may proceed to operation S120.

If the setup voltage GS or SS set up on one of the selection lines SSL and GSL is higher than the reference level Vref, then it may be determined that a desired time TD has elapsed from a setup point of time (or initialization) of the selection line. Thus, in operation S140, a timing circuit 165 (refer to FIG. 6) may start to set up (or begin charging) word lines. Here, the word lines may include selected and unselected word lines. Also, it should be understood that the word lines may include one or more dummy word lines.

For a cell string setup operation, word lines may start to be set up at a point in time delayed by a desired time from a setup point in time of the selection lines GSL and SSL. With this timing control scheme, it is possible to mitigate (or alternatively, prevent) voltage distortion generated when word lines are set up. In addition, it is possible to mitigate (or alternatively, prevent) read disturbance caused when a word line voltage is applied by a ground selection transistor being insufficiently turned on.

Figure 9:
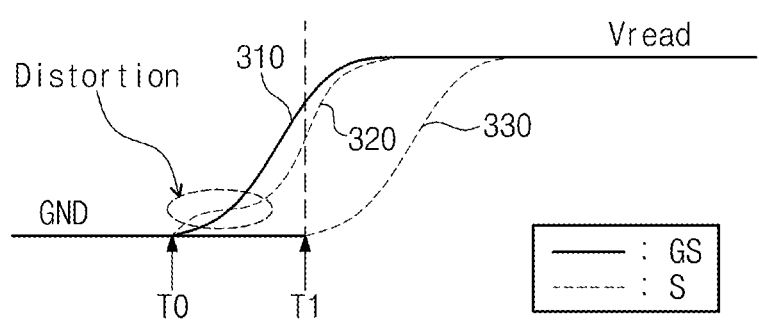
FIG. 9 is a waveform diagram schematically illustrating the effect of at least one example embodiment of inventive concepts.

FIG. 9 is a waveform diagram schematically illustrating an effect of inventive concepts. Referring to FIG. 9, there are illustrated a voltage 310 (illustrated by a solid line) set up on a ground selection line GSL and voltages 320 and 330 (illustrated by a dotted line) set up on word lines in a cell string selected at a read operation, A non-selection read voltage Vread may be applied to a ground selection line GSL from time T0. It is assumed that the non-selection read voltage Vread is applied to a word line at the same with the ground selection line GSL. With this assumption, the word line may be set up along a voltage waveform 320. The voltage waveform of the word line may include distortion as illustrated in FIG. 9. This voltage distortion may be caused by a difference between channel lengths as described above. In this case, a variation in a threshold voltage of a ground selection transistor GST may be generated by a resistance difference between a ground selection transistor GST and a common source line CSL. Although ground selection transistors GST are set up at the same point in time, turn-on times of the ground selection transistors GST may be different from one another due to a difference between threshold voltages of the ground selection transistors GST of cell strings. This may mean that channels of cell strings are formed at different points in time. Thus, the word line voltage may be distorted by such a factor that channels of cell strings are formed at different points of time. The voltage waveform 320 shows this distortion.

According to inventive concepts, word lines may be set up after the set up of a ground selection line GSL or a string selection line SSL is completed. That is, the selection lines SSL and GSL may start to be set up at time T0, and word lines may start to be set up at time T1. A voltage waveform 330 may show a word line voltage set up at a delayed point in time. Since the word line starts to be set up after selection transistors all are turned on, it is possible to mitigate (or alternatively, prevent) distortion of a word line voltage.

Figure 10A:
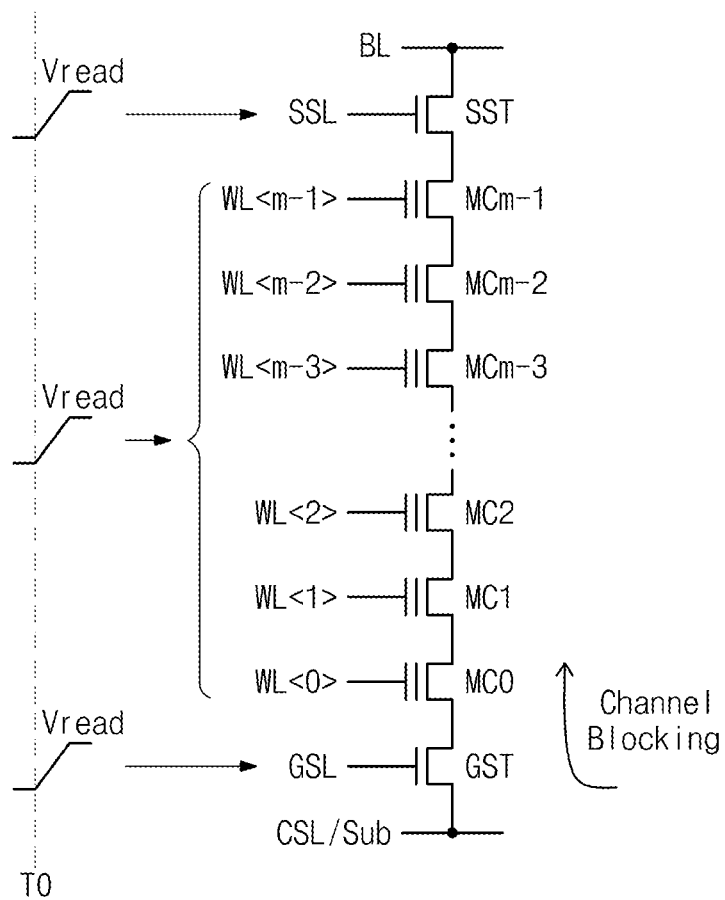
FIGS. 10A and 10B are circuit diagrams schematically illustrating the effects of conventional art compared to the effects at least one example embodiment of inventive concepts.
Figure 10B:
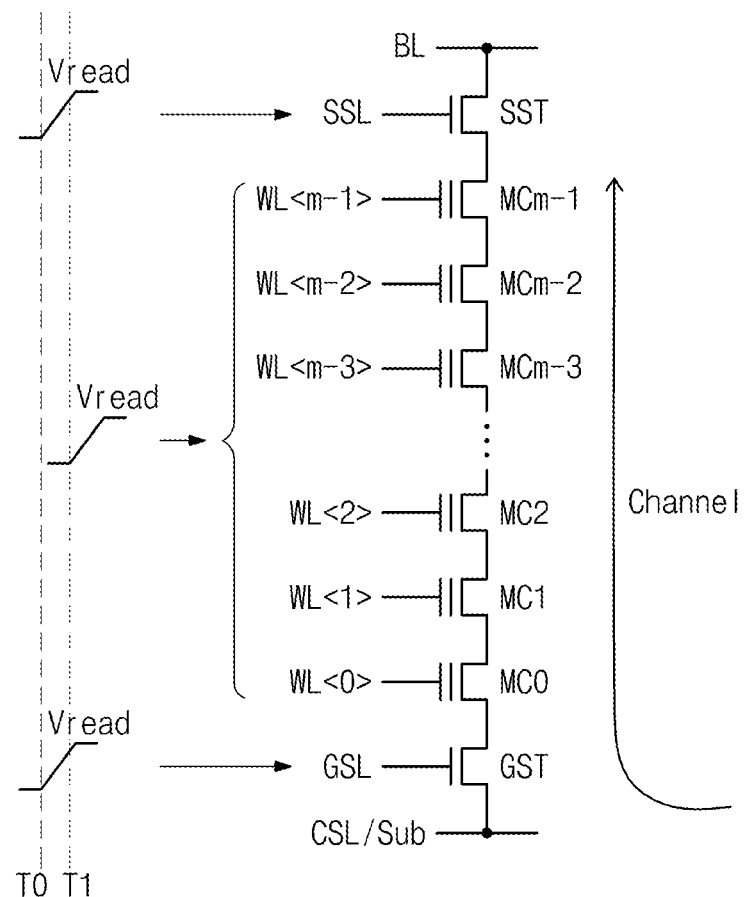

FIGS. 10A and 10B are circuit diagrams schematically illustrating the effects of conventional art compared to the effects at least one example embodiment of inventive concepts. FIG. 10A shows the conventional case, where selection lines SSL and GSL and word lines WL<0> to WL<m−1> are set up at the same point in time. FIG. 10B shows the case that word lines WL<0> to WL<m−1> are set up at a point of time delayed by a specific time from a point of time when selection lines SSL and GSL are set up, as in a device according to at least one example embodiment.

Referring to FIG. 10A, a conventional bias method on an unselected cell string at a read operation is illustrated. There is illustrated an example where a non-selection read voltage Vread is applied to word lines WL<0> to WL<m−1>. However, a selection read voltage Vrd may be applied to one of the word lines WL<0> to WL<m−1>. At time T0, the non-selection read voltage Vread may be applied to selection lines SSL and GSL and word lines word lines WL<0> to WL<m−1>. In this case, a channel of the cell string may be formed from a common source line side. If the non-selection read voltage Vread is applied to the word lines WL<0> to WL<m−1> before a channel is sufficiently formed, hot electrons may be injected into a charge storage layer of a corresponding cell. That is, read disturbance may be generated.

Referring to FIG. 10B, according to at least one example embodiment, there is illustrated an example where setup timing of the word lines WL<0> to WL<m−1> is later than setup timing of the selection lines SSL and GSL. At time T0, the selection lines SSL and GSL may start to be set up. However, the word lines WL<0> to WL<m−1> may start to be set up at time T1 after selection transistors SST and GST are sufficiently turned on. Thus, since a voltage is applied the word lines WL<0> to WL<m−1> after a channel of a cell string is sufficiently formed, it is possible to boost a channel potential. Accordingly, read disturbance is mitigated (or alternatively, prevented).

Figure 11:
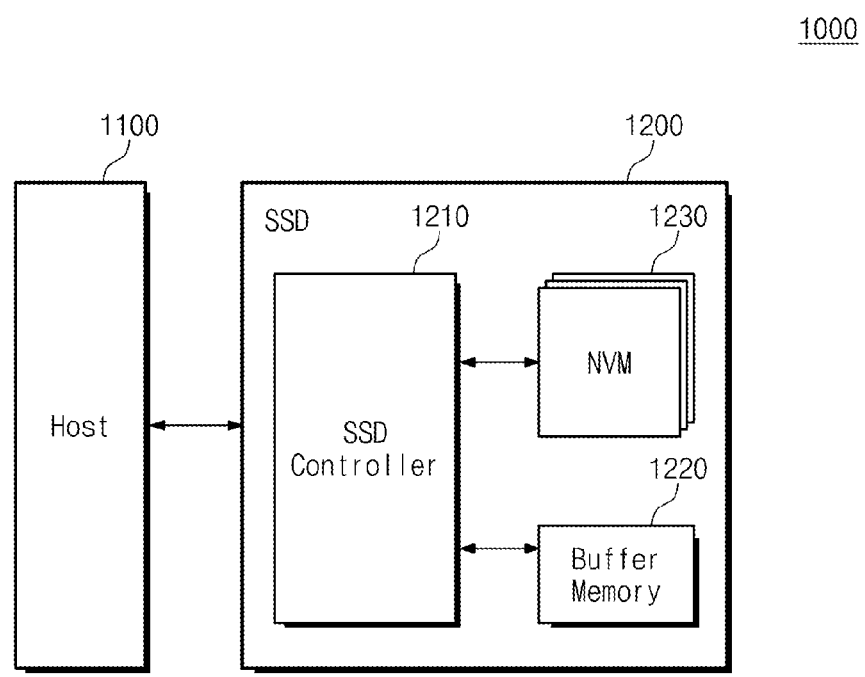
FIG. 11 is a block diagram illustrating a user device including a solid state drive according to at least one example embodiment of inventive concepts.

FIG. 11 is a block diagram illustrating a user device including a solid state drive according to at least one example embodiment of inventive concepts. Referring to FIG. 11, a user device 1000 may include a host 1100 and a solid state drive (hereinafter, referred to as SSD) 1200. The SSD 1200 may include an SSD controller 1210, a buffer memory 1220, and a nonvolatile memory device 1230.

The SSD controller 1210 may provide physical interconnection between the host 1100 and the SSD 1200. The SSD controller 1210 may provide an interface with the SSD 1200 corresponding to a bus format of the host 1100. In particular, the SSD controller 1210 may decode a command provided from the host 1100 to access the nonvolatile memory device 1230 based on the decoding result. The bus format of the host 1100 may include USB (Universal Serial Bus), SCSI (Small Computer System Interface), PCI express, ATA, PATA (Parallel ATA), SATA (Serial ATA), SAS (Serial Attached SCSI), and the like.

The buffer memory 1220 may temporarily store write data provided from the host 1100 or data read out from the nonvolatile memory device 1130. The buffer memory 1220 may be formed of a synchronous DRAM to provide sufficient buffering to the SSD 1200 used as a mass storage device. However, inventive concepts are not limited thereto.

The nonvolatile memory device 1230 may be provided as storage medium of the SSD 1200. For example, the nonvolatile memory device 1230 may be a vertical NAND flash memory device having a mass storage capacity. The nonvolatile memory device 1230 may be formed of a plurality of memory devices. In this case, memory devices may be connected with the SSD controller 1210 by the channel. There is described an example in which as a storage medium, the nonvolatile memory device 1230 is formed of a NAND flash memory. However, the nonvolatile memory device 1230 is not limited to a NAND flash memory device. For example, a storage medium of the SSD 1200 can be formed of a PRAM, an MRAM, a ReRAM, a FRAM, a NOR flash memory, and the like. Further, inventive concepts may be applied to a memory system which uses different types of memory devices together.

In the SSD 1200, the nonvolatile memory device 1230 may be a vertical NAND flash memory device having cell strings formed in a direction perpendicular to a substrate. The nonvolatile memory device 1230 may control setup points of times of word lines and a selection line at a specific mode of operation. For example, the nonvolatile memory device 1230 may control a setup point of time of a ground selection line to be faster than a setup point of time of word lines. Thus, it is possible to mitigate (or alternatively, prevent) distortion of a word line voltage and/or read disturbance.

Figure 12:
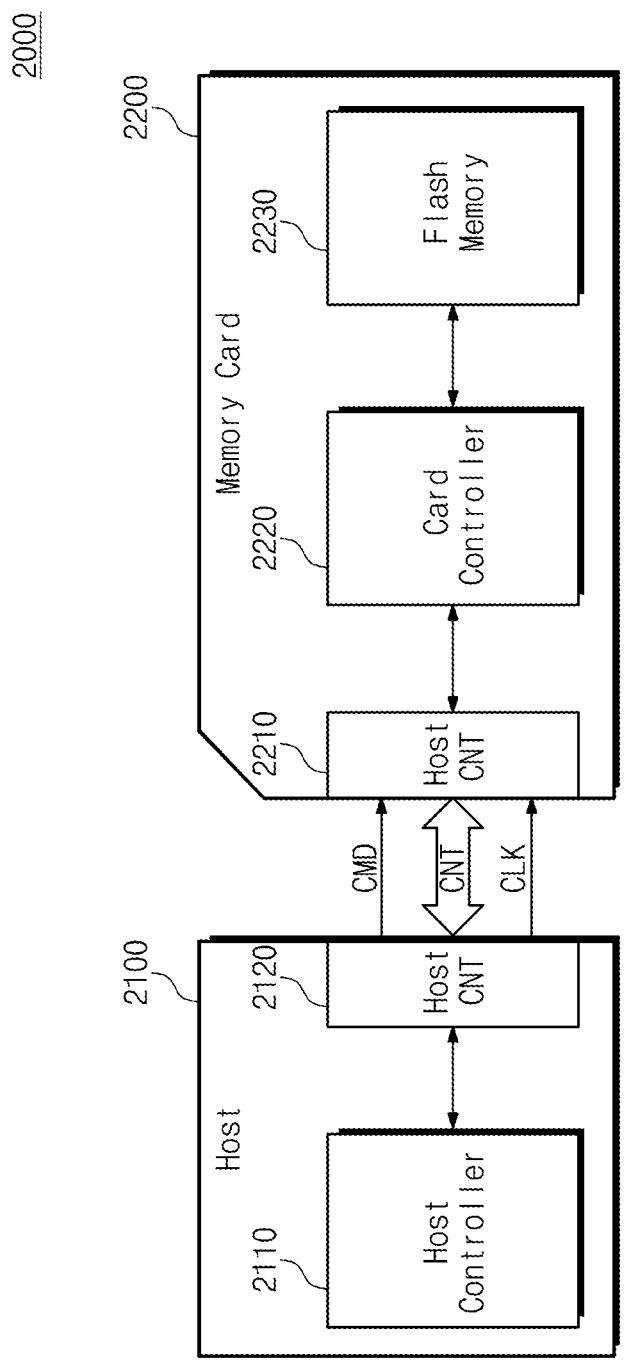
FIG. 12 is a block diagram illustrating a memory card according to at least one example embodiment of inventive concepts.

FIG. 12 is a block diagram illustrating a memory card according to at least one example embodiment of inventive concepts. Referring to FIG. 12, a memory card system 2000 may include a host 2100 and a memory card 2200. The host 2100 may include a host controller 2110 and a host connection unit 2120. The memory card 2200 may include a card connection unit 2210, a card controller 2220, and a flash memory 2230.

Each of the host connection unit 2120 and the card connection unit 2210 may be formed of a plurality of pins. Such pins may include a command pin, a data pin, a clock pin, a power pin, etc. The number of pins may vary according to a type of the memory card 2200. In at least one example embodiment, an SD card may include nine pins.

The host 2100 may be configured to write data in the memory card 2200 or to read data stored in the memory card 2200. The host controller 2110 may send a command (e.g., a write command), a clock signal CLK generated within a clock generator (not shown) of the host 2100, and data to the memory card 2200 via the host connection unit 2120.

The card controller 2220 may operate responsive to a write command received via the card connection unit 2210, and may store data in the flash memory 2230 in synchronization with a clock signal generated by a clock generator (not shown) of the card controller 2220. The flash memory 2230 may store data transferred from the host 2100. For example, if the host 2100 is a digital camera, the flash memory 2230 may store image data.

The flash memory 2230 may include memory stacked in a direction perpendicular to a substrate. For example, the flash memory 2230 may be a vertical NAND flash memory device having cell strings formed in a direction perpendicular to a substrate. The flash memory 2230 may control setup points of times of word lines and a selection line for a desired mode of operation. For example, in a read operation, the flash memory 2230 may control a setup point of time of a ground selection line to be faster than a setup point of time of word lines. Thus, it is possible to mitigate (or alternatively, prevent) distortion of a word line voltage or read disturbance.

The card connection unit 2210 may be configured to communicate with an external device (e.g., a host) using one of various interface protocols such as USB, MMC, PCI-E, SAS, SATA, PATA, SCSI, ESDI, IDE, and the like.

Figure 13:
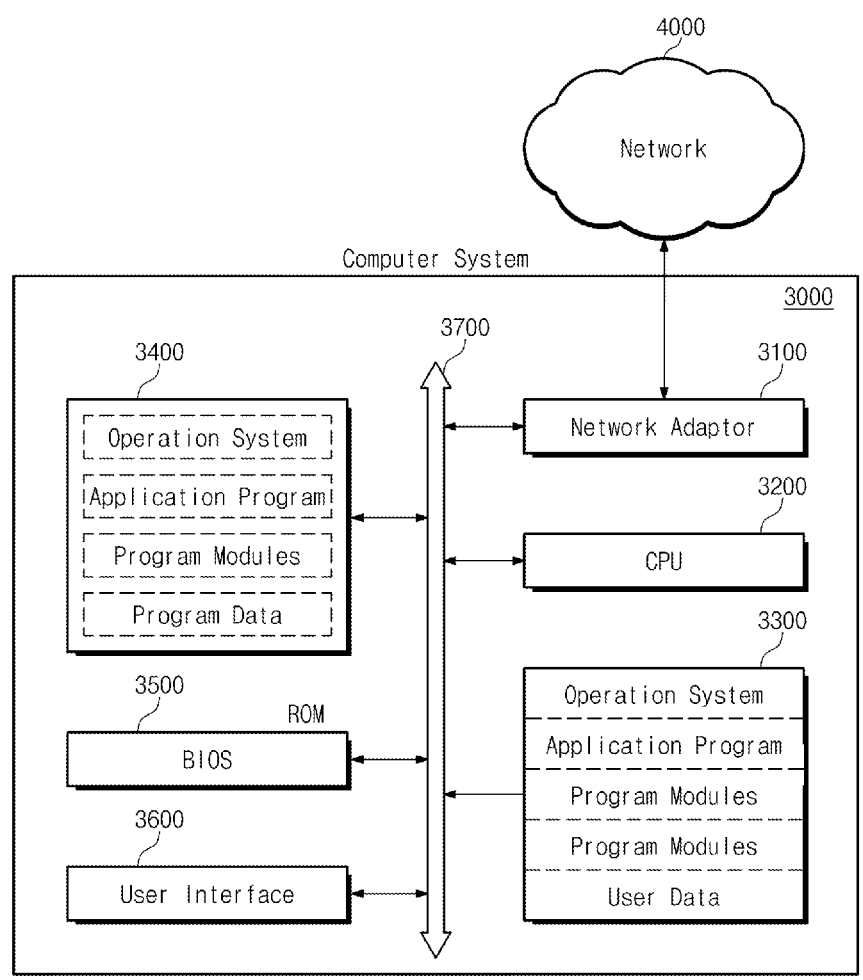
FIG. 13 is a block diagram schematically illustrating a computing system according to at least one example embodiment of inventive concepts.

FIG. 13 is a block diagram schematically illustrating a computing system according to at least one example embodiment of inventive concepts. Referring to FIG. 13, a computing system 3000 may include a network adaptor 3100, a CPU 3200, a mass storage device 3300, a RAM 3400, a rom 3500, and a user interface 3600 which are connected with a system bus 3700.

The network adaptor 3100 may provide an interface between the computing system 3000 and external networks 4000. The CPU 3200 may control an overall operation for driving an operating system and an application program which are resident on the RAM 3400. The data storage device 3300 may store data needed for the computing system 3000. For example, the data storage device 3300 may store an operating system for driving the computing system 3000, an application program, various program modules, program data, user data, and so on.

The RAM 3400 may be used as a working memory of the computing system 3000. Upon booting, the operating system, the application program, the various program modules, and program data needed to drive programs and various program modules read out from the data storage device 3300 may be loaded on the RAM 3400. The ROM 3500 may store a basic input/output system (BIOS) which is activated before the operating system is driven upon booting. Information exchange between the computing system 3000 and a user may be made via the user interface 3600.

In addition, the computing system 3000 may further include a battery, a modem, and the like. Although not shown, the computing system 3000 may further include an application chipset, a camera image processor (CIS), a mobile DRAM, and the like.

The mass storage device 3300 may include a flash memory device according to at least one example embodiment of inventive concepts. The flash memory device may control setup times of word lines and a selection line at a specific mode of operation (e.g., a read mode of operation). For example, the flash memory device may control a setup time of a ground selection line to be faster than a setup time of word lines. Thus, it is possible to mitigate (or alternatively, prevent) distortion of a word line voltage and/or read disturbance.

The mass storage device 3300 may be implemented by a solid state drive, a multimedia card (MMC), a secure digital (SD) card, a micro SD card, a memory stick, an ID card, a PCMCIA card, a chip card, an USB card, a smart card, a compact flash (CF) card, and so on. The mass storage device 3300 may perform a pseudo program operation according to a size of write requested data or/and a state of a buffer region.

A nonvolatile memory device and/or a memory controller may be packed by one selected from various types of packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

While inventive concepts have been described with reference to exemplary embodiments, it will be apparent to those skilled in the art that various changes and modifications may be made without departing from the spirit and scope of the inventive concepts. Therefore, it should be understood that the above described example embodiments are not limiting, but illustrative.

What is claimed is:

1. A vertical nonvolatile memory device which includes a plurality of cell strings formed in a direction intersecting with a substrate, the vertical nonvolatile memory device being configured to:
   detect, using a voltage generator including a timing circuit, a voltage level on at least one selection line connected to a cell string from among the plurality of cell strings;
   apply a non-selection read voltage to the at least one selection line; and
   apply the non-selection read voltage to at least one unselected word line of the cell string a desired time period after the applying of the non-selection read voltage to the at least one selection line.

2. The vertical nonvolatile memory device of claim 1, wherein the at least one selection line is a ground selection line connecting the cell string and a common source line.

3. The vertical nonvolatile memory device of claim 1, wherein the cell strings are disposed in a zigzag shape between word line cuts.

4. The vertical nonvolatile memory device of claim 1, further configured to:
   detect a level of a voltage on the at least one selection line.

5. The vertical nonvolatile memory device of claim 4, wherein the desired time period is based on a time when the detected voltage level is equal to or higher than a reference level.

6. The vertical nonvolatile memory device of claim 1, further configured to:
   apply a selection read voltage to a selected word line of the cell string after the desired time period.

7. A vertical nonvolatile memory device, comprising:
   a cell array including a plurality of cell strings formed in a direction perpendicular to a substrate;
   a row decoder connected to word lines and selection lines of the cell strings and configured to selectively transfer a word line voltage to the word lines and a selection line voltage to the selection lines; and
   a voltage generator configured to supply, for a read operation, the row decoder with the selection line voltage and the word line voltage such that the word line voltage is applied to at least one word line of the word lines a desired time period after the selection line voltage is applied to at least one selection line of the selection lines, the voltage generator including a timing circuit configured to detect a voltage level on the at least one selection line.

8. The vertical nonvolatile memory device of claim 7, wherein the at least one selection line is a ground selection line configured to connect to at least one of the cell strings and a common source line.

9. The vertical nonvolatile memory device of claim 7, wherein the timing circuit is configured to control a duration of the desired time period.

10. The vertical nonvolatile memory device of claim 9, wherein the timing circuit includes a delta set fuse configured to determine a difference between a voltage on the at least one word line and the detected voltage level on the selection line;

a circuit element configured to calculate a reference value based on the difference and a target voltage of the at least one word line;

a comparator configured to compare the detected voltage level on the selection line with the reference value; and a word line voltage generator configured to generate the word line voltage in response to an output of the comparator.

11. The vertical nonvolatile memory device of claim 10, wherein the comparator is configured to activate the word line voltage generator if the detected voltage level on the selection line is higher than the reference value.

12. The vertical nonvolatile memory device of claim 7, wherein the cell strings are disposed in a zigzag shape between word line cuts.

13. A memory device, comprising:

a non-volatile memory cell array including a plurality of cell strings formed in a vertical direction on a substrate, each cell string having at least one word line and at least one selection line; and a voltage generator connected to the cell strings, the voltage generator being configured to generate a word line voltage and a selection line voltage such that, for a read operation, the at least one word line begins charging a desired time period after the at least one selection line begins charging, the voltage generator including a timing circuit configured to detect a voltage level on the at least one selection line.

14. The memory device of claim 13, wherein the timing circuit is configured to determine the desired time period based on the detected voltage level.

15. The memory device of claim 14, wherein the timing circuit is configured to determine the desired time period as a time difference between a first instant in time and a second instant in time, the first instant in time corresponding to an instant in time when the selection line voltage is initially applied to the at least one selection line, the second instant in time corresponding to an instant in time when the detected voltage level reaches a threshold voltage level after the initial application of the selection line voltage.

16. The memory device of claim 13, wherein the at least one selection line is a ground selection line.

17. The memory device of claim 16, wherein the at least one word line is an unselected word line.

18. The memory device of claim 13, wherein the plurality of cell strings includes a plurality of conductive pillars formed in a zigzag pattern.

19. The memory device of claim 18, wherein the conductive pillars are separated by at least one word line cut.

* * * * *